THREE-ELECTRODE SEMICONDUCTOR DEVICE

Filed May 31, 1949

Inventor

JOHN P. STELMAK

By H. L. Newton

Attorney

Patented Sept. 2, 1952

2,609,427

UNITED STATES PATENT OFFICE 2,609,427

THREE-ELECTRODE SEMICONDUCTOR DEVICE

John P. Stelmak, Forest Hills, N. Y., assignor to Radio Corporation of America, a corporation of Delaware Application May 31, 1949, Serial No. 96,356

3 Claims. (Cl. 175—366)

This invention relates generally to semi-conductor devices and particularly to a novel construction for a three-electrode semi-conductor amplifier, oscillator or the like.

The three-electrode semi-conductor is a recent development in the field of electronic amplification. This device is presently known as a "transistor," and its essential characteristics have been disclosed in a series of three letters to the Physical Review by Bardeen and Brattain, Brattain and Bardeen, and Shockley and Pearson which appear on pages 230 to 233 of the July 15, 1948 issue. The new amplifier device includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conductor. The input circuit of the amplifier described in the publication referred to above is connected between the emitter electrode and the base electrode while the output circuit is connected between the collector electrode and the base electrode. In this circuit the base electrode is the common input and output electrode and may, therefore, be grounded.

A semi-conductor device of the type described in the publications referred to is rather difficult to manufacture. The semi-conducting material is provided with two point electrodes consisting of wires which are spaced apart approximately two mils. Thus, it will readily be seen that the exact positioning of the point electrodes is fairly difficult. Furthermore, the pressure between the two point electrodes and the semi-conducting material should be fairly high in order to provide the required contact between the electrodes and the semi-conducting material. Since the wires from which the point electrodes are made have a diameter of the order of 5 mils or less, they must be made of a stiff spring-like metal in order to obtain the required contact pressure. However, since a germanium crystal is very hard and brittle, the contact between the crystal and a stiff, hard metal such as tungsten is relatively poor. It is believed that this causes a considerable noise due to minute variations of the contact areas between the electrodes and the crystal.

Another drawback of the conventional semi-conductor device as described in the publications referred to and elsewhere is the small heat dissipation of the point electrodes due to their small mass. Furthermore, the power output which can be obtained with a conventional three-electrode semi-conductor amplifier is limited. This is also believed to be due at least in part to the small contact areas between the point electrodes and the crystal and also due to the small diameters of the electrodes.

It is accordingly the principal object of the present invention to provide an improved multi-electrode semi-conductor device suitable for use as an amplifier, oscillator or the like purposes which is easier to manufacture, has a better mechanical stability and improved electrical characteristics.

A further object of the invention is to provide a novel three-electrode semi-conductor device which permits a higher contact pressure between the semi-conducting crystal and its small-area electrodes thereby to decrease the noise caused by variations of the contact pressure between the electrodes and the crystal.

Another object of the invention is to provide a semi-conductor device of the type referred to having a higher heat dissipation and permitting larger power outputs than previously known semi-conductor devices having point electrodes.

In accordance with the present invention a block or cube of semi-conducting material is provided having a substantially straight edge. The two small-area electrodes of the device may consist of conductive or metallic ribbons or strips arranged parallel to each other and at right angles to the edge of the semi-conducting material. The metallic ribbons may be provided with knife edges for contacting the edge of the semi-conducting material thereby to decrease the point-like contact areas between the ribbons and the semi-conducting material. This construction permits the use of a softer metal such as Phosphor bronze for the electrodes which can better follow the irregular microscopic surface of the crystal, thereby to provide a better contact between the electrodes and the semi-conducting material. Furthermore, a higher contact pressure may be obtained which also tends to reduce noise caused by variation of the contact pressure. Finally, the heat dissipation as well as the power output of the device of the invention are very good.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
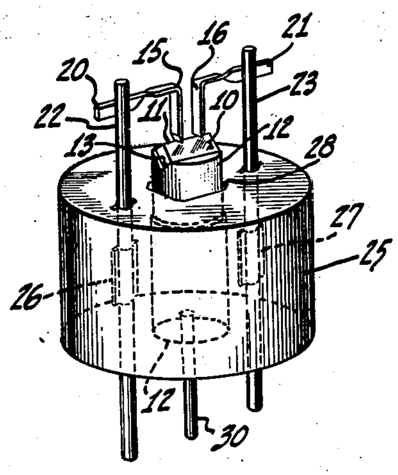
Figure 1 is a view in perspective of a three-electrode semi-conductor device embodying the present invention.
Figure 2:
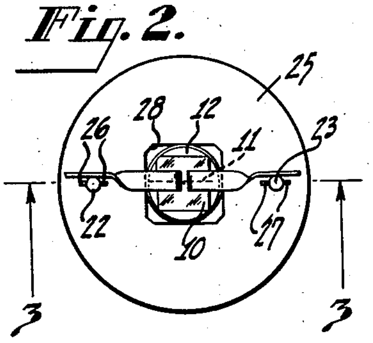
Figure 2 is a top plan view of the device of Figure 1.
Figure 3:
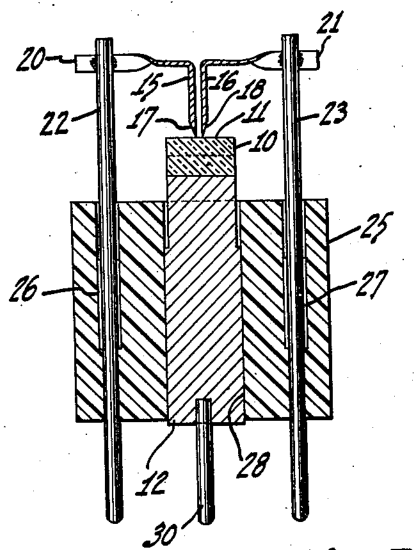
Figure 3 is a sectional view taken on line 3—3 of Figure 2.

Referring now to the drawing in which like components have been designated by the same reference numerals throughout the figures, and particularly to Figures 1 to 3, there is illustrated a semi-conductor device embodying the present invention which may be used as an amplifier, oscillator or the like. The device comprises a block or cube 10 of semi-conducting material consisting, for example, of a semi-conducting element such as germanium, silicon, boron, tellurium or selenium containing a small but sufficient number of atomic impurity centers or lattice imperfections as commonly employed for best results in semi-conductor devices such as crystal rectifiers. Germanium is the preferred material for block 10 and may be prepared so as to be an electronic N type semi-conductor as is well known. The surface of semi-conducting block 10 may be polished and etched in the manner explained in the paper by Bardeen and Brattain referred to. It is also feasible to utilize the germanium block from a commercial high-back-voltage germanium rectifier such as the type 1N34 in which case further surface treatment may not be required.

As clearly shown in Figure 1, block 10 may have the shape of a cube of semi-conducting material. However, all that is necessary is that the upper portion of block 10 is of wedged shape to provide a substantially straight edge 11 on which the small-area electrodes may bear. Thus, block 10 may be provided with three or more electrodes, that is, with a large-area low-impedance base electrode and with two small-area electrodes which may be used as the emitter and collector electrodes in a three-electrode semi-conductor amplifier. Block 10 is electrically connected and secured to metallic stud 12 which may, for example, consist of brass. Stud 12 is provided with a suitable wedge-shaped aperture 13 for receiving the lower portion of block 10 to which it may be soldered. Stud 12 preferably has a circular cross section as clearly shown in Figure 2.

The two small-area electrodes consist of two metallic ribbons or strips 15, 16. Ribbons 15, 16 may, for example, consist of a small strip of a high tensile strength metal such as Phosphor bronze sheet material which may, for example, have a thickness of 5 mils. As clearly shown in Figures 1 and 3, ribbons 15, 16 are each provided with a knife edge or flat chisel point 17, 18 having a fine edge of approximately .5 mil thickness. The chisel points may, for example, form an angle of 37 degrees with a vertical line. Ribbons 15, 16 are provided with a 90 degrees bend as clearly shown on the drawing. The outer ends 20, 21 of ribbons 15, 16 preferably have a 90 degrees twist to facilitate their connection to supports 22 and 23 to which they may be welded or otherwise fastened. Supports 22, 23 may consist of a suitable metallic wire such as nickel.

Supports 22 and 23 are permanently secured to and extend through cylinder 25 consisting of a suitable insulating material such as Bakelite. As shown in the drawing, supports 22, 23 are provided with locking flats 26, 27 extending through suitable slots in cylinder 25. This will prevent supports 22, 23 from rotating with respect to cylinder 25. Cylinder 25 is provided with a suitable bore 28 which may have a square cross section with rounded corners as illustrated in Figure 2. Stud 12 has a press fit with cylinder 25 and may be forced upwards to engage block 10 with metallic ribbons 15, 16.

As clearly shown in the drawing, knife edges 17, 18 extend substantially at right angles with straight edge 11 of block 10. Accordingly, the contact area between metallic ribbons 15, 16 which represent the emitter and collector electrodes and block 10 is very small or point-like. The distance between knife edges 17 and 18 may be of the order of 2 mils.

The semi-conductor device of the invention is assembled in the following manner. At first, block 10 is soldered or sweated to stud 12 which may then be provided with a wire 30 received in a suitable opening in the lower portion of the stud to facilitate electrical connection to stud 12 which functions as the base electrode. Now, supports 22 and 23 are inserted into cylinder 25 and ribbons 15, 16 are welded or otherwise secured to their respective supports. Care should be taken that knife edges 17, 18 are substantially parallel to each other, that their spacing corresponds to a predetermined value and that they are both located in a common plane. It will be obvious that position of knife edges 17, 18 need only be controlled in one direction, that is, only the spacing between the knife edges must conform to the desired value. Now, stud 12 is pushed or forced through opening 28 until edge 11 of block 10 contacts both metallic ribbons 15 and 16. Finally, stud 12 is pushed a further predetermined distance into cylinder 25 to provide the required contact pressure between knife edges 17, 18 and block 10.

Ribbons 15, 16 should consist of a suitable metal which is comparatively soft to insure an intimate contact between knife edges 17, 18 and the microscopic irregularities of the straight edge 11 of block 10. Furthermore, the material of which ribbons 15, 16 consist should be sufficiently stiff to provide the desired contact pressure. It will be evident that the horizontal portions of ribbons 15, 16 will bend when block 10 is pushed upwards against the ribbons, thereby to provide the required pressure. Due to the 90 degrees twist in ribbons 15, 16 the cross section of the ribbons at their welds present a large moment of inertia. Normally, a Phosphor bronze wire or strip becomes rather soft adjacent the weld and consequently bends at this point. Since ribbons 15, 16 are arranged vertically adjacent their welds with supports 22, 23 they will not yield under the pressure produced by block 10.

Figure 4:
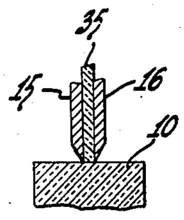
Figure 4 is a side view of a modified electrode construction.

As illustrated in Figure 4 it is also feasible to provide the flat surface of one of the ribbons 15 or 16 with an insulating film 35 to maintain the spacing between the two ribbons at a predetermined value such as two mils. Alternatively, a separator insulating strip 35 may be provided between the two ribbons 15, 16.

There has thus been disclosed an improved three-electrode semi-conductor device suitable as an amplifier, oscillator or the like purposes. The small-area electrodes of the device, that is, the emitter and collector electrodes are of very rugged construction which permits higher contact pressures than have been obtained heretofore. Furthermore, the particular design of the small-area electrodes in the form of flat metallic ribbons will provide a better spring action so that a softer metal such as Phosphor bronze may be utilized. This, in turn, will provide a more intimate contact between the electrodes and the semi-conducting material which considerably reduces noise due to variations of the contact pressure. Furthermore, the heat capacity of the small-area electrodes is larger which in turn improves the heat dissipation and permits higher output power. The device of the present invention is mechanically superior to previously known semi-conductor devices and its electrical characteristics are equal to or superior to previously known semi-conductor devices having point electrodes.

What is claimed is:

1. A semi-conductor device comprising a cube-shape block of semi-conducting material having a substantially straight edge, a first electrode providing a low-resistance contact with said block, a second and a third electrode, each consisting of a ribbon of high tensile strength and softer than said block, each of said ribbons having a bend and a substantially right angle twist intermediate its ends, a metallic support for one end of each of said ribbons, the other end of each of said ribbons being provided with a knife edge, said supports being disposed with respect to said block so that said knife edges are disposed substantially at right angles with respect to said straight edge, and means for pressing the knife edges of said ribbons against said straight edge to provide intimate contacts of relatively small areas between said ribbons and said block.

2. A semi-conductor device comprising a block of semi-conducting material having substantially a straight edge, a conductive member having an opening shaped to receive said block, said member providing a relatively low-resistance contact with said block, a pair of additional conductive supports extending in a plane intersecting said straight edge, two conductive ribbons, each being provided with a bend and a substantially right angle twist intermediate its ends and having one end secured to one of said pair of supports, the free ends of said ribbons being provided with knife edges, said ribbons being secured to said supports so that their knife edges are disposed substantially parallel to each other and at right angles to said straight edge of the block, and means for pressing said ribbons against said straight edge to provide a relatively small intimate contact between each of said ribbons and said block.

3. A semi-conductor device comprising a cube of semi-conducting material having a substantially straight edge, a metallic stud having a wedge shape opening for receiving said cube and for providing a large-area contact with said cube, a pair of metallic supports extending vertically on opposite sides of said straight edge, two metallic ribbons, each being provided with a right-angle bend intermediate its ends and with a right angle twist and having one end secured to one of said supports, the free ends of said ribbons being provided with knife edges, said ribbons being disposed with their knife edges substantially parallel to each other and at right angles to said straight edge, and means for pressing said ribbons against said straight edge to provide a relatively small intimate contact between each of said ribbons and said cube.

JOHN P. STELMAK.

REFERENCES CITED

The following references are of record in the file of this patent:

UNITED STATES PATENTS

| Number | Name | Date |
|---|---|---|
| 2,410,268 | Carlson | Oct. 29, 1946 |
| 2,486,776 | Barney | Nov. 1, 1949 |
| 2,502,479 | Pearson et al. | Apr. 4, 1950 |

FOREIGN PATENTS

| Number | Country | Date |
|---|---|---|
| 21,408 | Great Britain | Apr. 9, 1908 |
| 599,341 | Great Britain | Mar. 10, 1948 |